United States Patent
Yamanaka

(10) Patent No.: US 6,899,435 B2
(45) Date of Patent: May 31, 2005

(54) ILLUMINATION APPARATUS AND IMAGE PROJECTION APPARATUS USING THE ILLUMINATION APPARATUS

(75) Inventor: Kazuya Yamanaka, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/444,905

(22) Filed: May 22, 2003

(65) Prior Publication Data

US 2003/0218723 A1 Nov. 27, 2003

(30) Foreign Application Priority Data

May 24, 2002 (JP) ........................................ 2002-151036

(51) Int. Cl.$^7$ .............................................. G03B 21/14
(52) U.S. Cl. ............................ 353/94; 353/31; 348/801
(58) Field of Search .............................. 353/31, 87, 94; 349/5, 7, 8, 9; 348/742, 743, 771, 801

(56) References Cited

U.S. PATENT DOCUMENTS

| | | | |
|---|---|---|---|
| 6,188,427 B1 * | 2/2001 | Anderson et al. | 347/255 |
| 6,511,184 B2 * | 1/2003 | Yamagishi et al. | 353/31 |
| 2002/0080834 A1 | 6/2002 | Kusunose | |
| 2002/0196377 A1 * | 12/2002 | Furukawa et al. | 348/742 |
| 2003/0076057 A1 | 4/2003 | Fleury | |
| 2003/0117591 A1 * | 6/2003 | Stanton | 353/31 |

FOREIGN PATENT DOCUMENTS

| | | |
|---|---|---|
| JP | 02257191 | 10/1990 |
| JP | 02257192 | 10/1990 |
| JP | 02257193 | 10/1990 |
| JP | 06082909 | 3/1994 |
| JP | 10-293233 | 11/1998 |
| JP | 10-333588 | 12/1998 |
| JP | 2000-294491 | 10/2000 |

* cited by examiner

Primary Examiner—William C. Dowling
(74) Attorney, Agent, or Firm—Volpe and Koenig, P.C.

(57) ABSTRACT

An illumination apparatus which illuminates a portion to be illuminated with light from a light source comprises a plurality of light emitting members constituting the light source, a driving circuit which drives the respective light emitting members, a condenser optical system which condenses an emitted light from the light emitting member drove by the driving circuit onto the portion to be illuminated, a light control member which performs change of a light path of the light from the light emitting member to illuminate the portion to be illuminated and/or movement of the light emitting member, a movable section which operates the light control member in a predetermined period, and a light selection control section which controls the movable section and/or driving circuit so as to select the light to illuminate the portion to be illuminated from the lights of the plurality of light emitting members.

54 Claims, 10 Drawing Sheets

ILLUMINATION APPARATUS AND IMAGE PROJECTION APPARATUS USING THE ILLUMINATION APPARATUS

CROSS-REFERENCE TO RELATED APPLICATIONS

This application is based upon and claims the benefit of priority from the prior Japanese Patent Application No. 2002-151036, filed May 24, 2002, the entire contents of which are incorporated herein by reference.

BACKGROUND OF THE INVENTION

1. Field of the Invention

The present invention relates to an illumination apparatus which illuminates a portion to be illuminated with light from light emitting members such as a light-emitting diode (LED), and an image projection apparatus in which the illumination apparatus is used.

2. Description of the Related Art

Examples of a condenser illumination apparatus which illuminates a specified portion with high efficiency have heretofore been known such as a car headlight, stand illumination, spot light, flashlight, and illumination unit for a data projector. In this condenser illumination apparatus, light from a light emitting source closer to a point source is reflected by a reflection unit whose reflection shape is devised, directivity of a light flux of the reflected light is enhanced by an optical lens, and the reflected light is usually used to effectively perform condenser illumination.

In the same manner as in conventional illumination, even in these condenser illumination apparatus, there is much demand for obtaining a brighter illumination light without excessively enlarging a size of the apparatus. In order to obtain the brighter illumination light, the size of the condenser illumination apparatus tends to increase. Particularly to enlarge an applied power of the light emitting source, thereby to increase q quantity of output light, and additionally to enhance a condenser capability, the reflection unit or optical lens is applied which is relatively enlarged with respect to the light emitting source. Therefore, to obtain brightness with good condenser efficiency, the size of the illumination apparatus has to be necessarily enlarged with respect to the light emitting source. In other words, with a small-sized light emitting source which has a high output and which is close to the point source, it is also possible to miniaturize the whole illumination apparatus. From this demand, the miniaturization of the light emitting source of a conventional system has also been advanced, and particularly a small-sized light emitting source by a discharge type from which the high output is possible has been effective means at present. Additionally, even with the light emitting source of the small-sized discharge type, the driving by a high-voltage power source is required in which it is difficult to reduce a circuit scale. There are other many problems with respect to the miniaturization of the total illumination apparatus. It is said that the miniaturization has already substantially approached limitation.

On the other hand, LED is remarkably noted as a next-generation small-sized light emitting source nowadays. The LED has heretofore had advantages such as small size, high durability, and long life, but has been mainly used as indicator illumination for various instruments or a confirmation lamp of a control stage because of restrictions of emission efficiency and emission output. However, in recent years, the emission efficiency has been rapidly improved, and it is said to be a matter of time before the emission efficiency exceeds that of a high-pressure mercury lamp or fluorescent lamp of the discharge type assumed to have heretofore had highest efficiency. By appearance of the high-efficiency high-brightness LED, the high-output light emitting source by the LED has rapidly been brought into a practical use. In recent years, in addition to red and green, a blue LED has entered a practical-use stage, and this also accelerates the application of the light emitting source. In actual, a plurality of high-efficiency high-brightness LED are used to start the practical use in traffic lights, large-sized full-color displays for outdoors, various car lamps, and backlights of liquid crystal displays in the cellular phones, which has heretofore been impossible in brightness or efficiency.

It is thought that this high-efficiency high-brightness LED is also applied as a promising small-sized light emitting source of the illumination apparatus requiring a condensing property. The LED is originally superior to the other light emitting sources in life, durability, lighting-on speed, and simplicity of a lighting-on/driving circuit. Above all, the blue color is added, three primary colors are obtained as spontaneous-light emitting sources, and an application range of a full-color image display apparatus has therefore been enlarged. Typical examples of the illumination apparatus whose condensing property is demanded include a projector display apparatus (image projection apparatus) in which a display image is formed and projected from image data. The image projection apparatus has heretofore separated desired primary colors from a white-based light emitting source by color filters, and has subjected the image data corresponding to each color to spatial light modulation. When the light obtained by the spatial light modulation is spatially or temporally synthesized, color image display is possible. When the white-based light emitting source is used, only the desired color is separated and used. Therefore, the colors other than the separated color are uselessly discarded by the filter in many cases. In this respect, since the LED emits the light of the desired color itself, a necessary quantity of light can be emitted when necessary. As compared with the conventional white-based light emitting source, the light is not wasted, and the light of the light emitting source can be used with good efficiency.

This superior application condition of the LED has been noticed. For example, Jpn. Pat. Appln. KOKAI Publication No. 11-32278, U.S. Pat. No. 6,227,669B1, U.S. Pat. No. 6,318,863, and the like disclose an example in which the LED is applied to the illumination apparatus for the image projection apparatus. The technique disclosed in these publications comprises: disposing a plurality of LEDs to secure a quantity of light; condensing some of fluxes from the individual light emitting sources by optical elements such as the optical lens; and controlling the fluxes so that a light modulation element to be irradiated is well defined at an allowed incidence angle. For the light modulation elements such as a liquid crystal device broadly used in general, since the allowed incidence angle is small, it is supposedly ideal to form the flux having higher parallelism and to irradiate the elements. This is a very important point in enhancing light use efficiency in the light modulation element.

Moreover, as the characteristic of the LED, it is generally known that heat is generated with the emission of the LED and that the emission output of the LED drops in inverse proportion to the increase of the generated heat. To solve the problem, in Jpn. Pat. Appln. KOKAI Publication No. 6-13652, it is disclosed that the current is controlled in order to prevent the heat generation, and driving (pulse driving) is performed in order to obtain a non-emission time. Accordingly, the quantity of emitted light is maintained.

BRIEF SUMMARY OF THE INVENTION

An object of the present invention is to provide an illumination apparatus which is bright or which can be miniaturized, and to provide an image projection apparatus which includes the illumination apparatus and from which similar effects are obtained.

According to a first aspect of the present invention, there is provided an illumination apparatus which illuminates a portion to be illuminated with light from a light source, comprising:

a plurality of light emitting members which constitute the light source;

a driving circuit configured to drive the respective light emitting members;

a condenser optical system configured to condense an emitted light from the light emitting member drove by the driving circuit onto the portion to be illuminated;

a light control member configured to perform at least one of change of a light path of the light from the light emitting member to illuminate the portion to be illuminated and movement of the light emitting member;

a movable section configured to operate the light control member in a predetermined period; and a light selection control section configured to control at least one of the movable section and driving circuit so as to select the light to illuminate the portion to be illuminated from the lights of the plurality of light emitting members.

According to a second aspect of the present invention, there is provided an image projection apparatus comprising:

an illumination apparatus which illuminates a portion to be illuminated with light from a light source, including:

a plurality of light emitting members which constitute the light source;

a driving circuit configured to drive the respective light emitting members;

a condenser optical system configured to condense an emitted light from the light emitting member drove by the driving circuit onto the portion to be illuminated;

a light control member configured to perform at least one of change of a light path of the light from the light emitting member to illuminate the portion to be illuminated and movement of the light emitting member;

a movable section configured to operate the light control member in a predetermined period; and a light selection control section configured to control at least one of the movable section and driving circuit so as to select the light to illuminate the portion to be illuminated from the lights of the plurality of light emitting members;

an image display element disposed in the portion to be illuminated of the illumination apparatus; and a projection optical system configured to project an image of the image display element to display enlarged image.

According to a third aspect of the present invention, there is provided an illumination apparatus which illuminates a portion to be illuminated with light from a light source, comprising:

a plurality of light emitting members which constitute the light source;

driving means for driving the respective light emitting members;

condenser means for condensing an emitted light from the light emitting member drove by the driving means onto the portion to be illuminated;

a light control member for performing at least one of change of a light path of the light from the light emitting member to illuminate the portion to be illuminated and movement of the light emitting member;

movable means for operating the light control member in a predetermined period; and light selection control means for controlling at least one of the movable means and driving means so as to select the light to illuminate the portion to be illuminated from the lights of the plurality of light emitting members.

According to a fourth aspect of the present invention, there is provided an image projection apparatus comprising:

an illumination apparatus for illuminating a portion to be illuminated with light from a light source, including:

a plurality of light emitting members which constitute the light source;

driving means for driving the respective light emitting members;

condenser means for condensing an emitted light from the light emitting member drove by the driving means onto the portion to be illuminated;

a light control member for performing at least one of change of a light path of the light from the light emitting member to illuminate the portion to be illuminated and movement of the light emitting member;

movable means for operating the light control member in a predetermined period; and light selection control means for controlling at least one of the movable means and driving means so as to select the light to illuminate the portion to be illuminated from the lights of the plurality of light emitting members;

an image display element disposed in the portion to be illuminated of the illumination apparatus; and a projection optical system configured to project an image of the image display element to display enlarged image.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

Embodiments of the present invention will be described hereinafter with reference to the drawings.

[First Embodiment]

Figure 1:
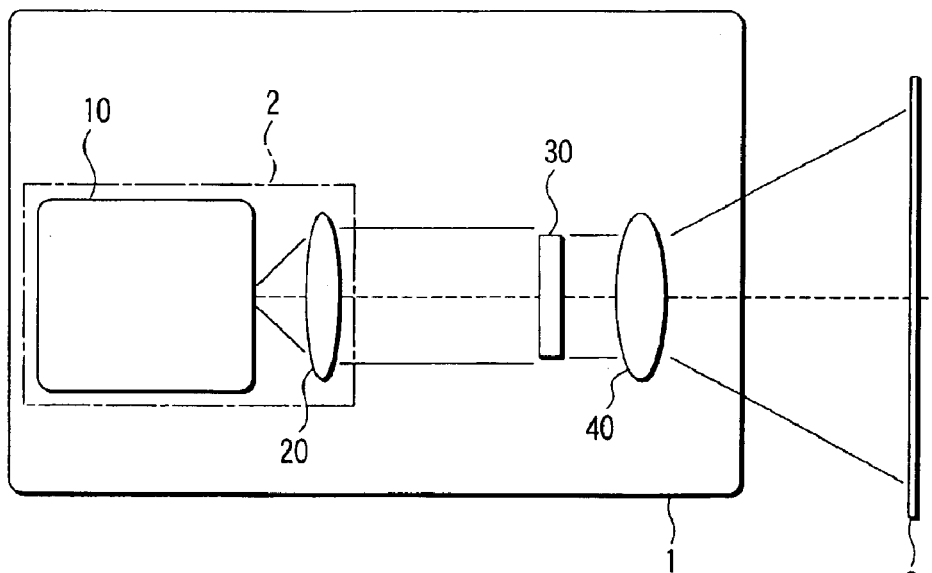
FIG. 1 is a function block diagram of an image projection apparatus (projector) according to a first embodiment of the present invention in which an illumination apparatus according to the first embodiment of the present invention is used.

FIG. 1 is a function block diagram of an image projection apparatus (projector) 1 according to a first embodiment of the present invention in which an illumination apparatus 2 according to the first embodiment of the present invention is used. Here, the illumination apparatus 2 according to the present embodiment includes: a successively moving emission illumination unit 10 described later in detail; and an illumination optical system 20 as condensing means. Moreover, in addition to the illumination apparatus 2, the image projection apparatus 1 of the present embodiment includes: an image display element 30 disposed in a portion to be illuminated which is efficiently illuminated with light from the successively moving emission illumination unit 10 by the illumination optical system 20 so as to display an image; and a projection optical system 40 for enlarging/projecting the image of the image display element 30 onto a screen S.

Details of the successively moving emission illumination unit 10 will be described hereinafter.

Figure 3:
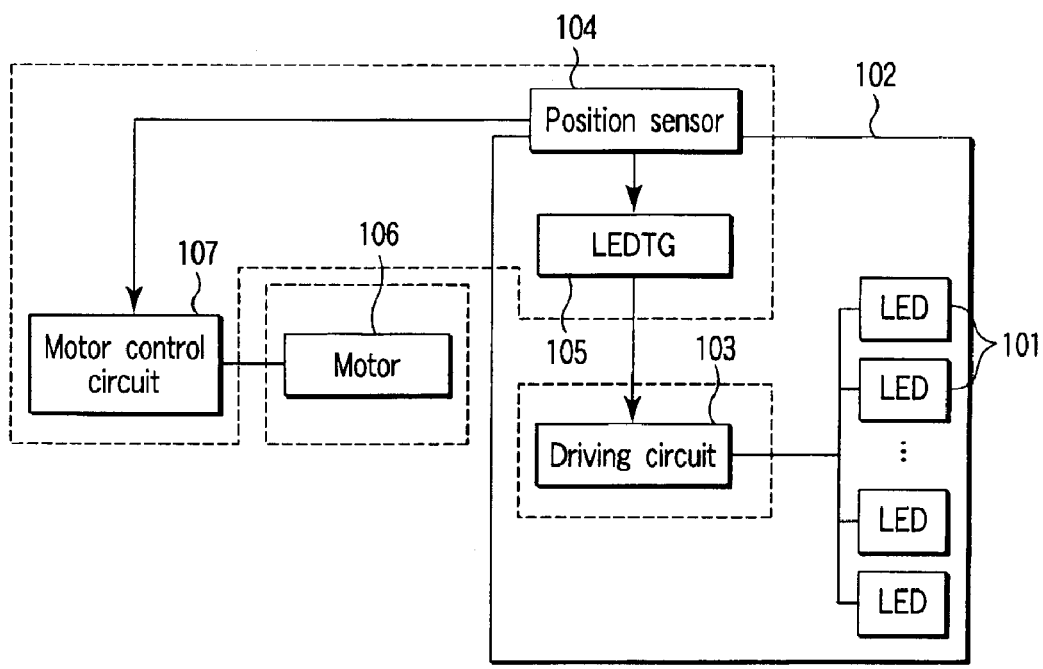
FIG. 3 is an electric block diagram of the successively moving emission illumination unit in the first embodiment.
Figure 2B:
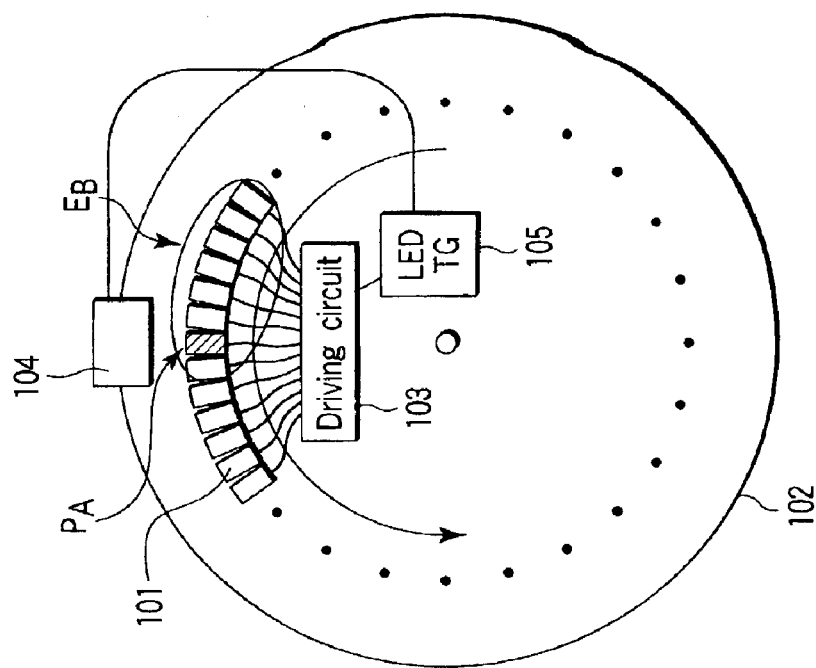
FIG. 2B is a front view of a rotatable substrate in FIG. 2A seen in an arrow W direction.
Figure 2A:
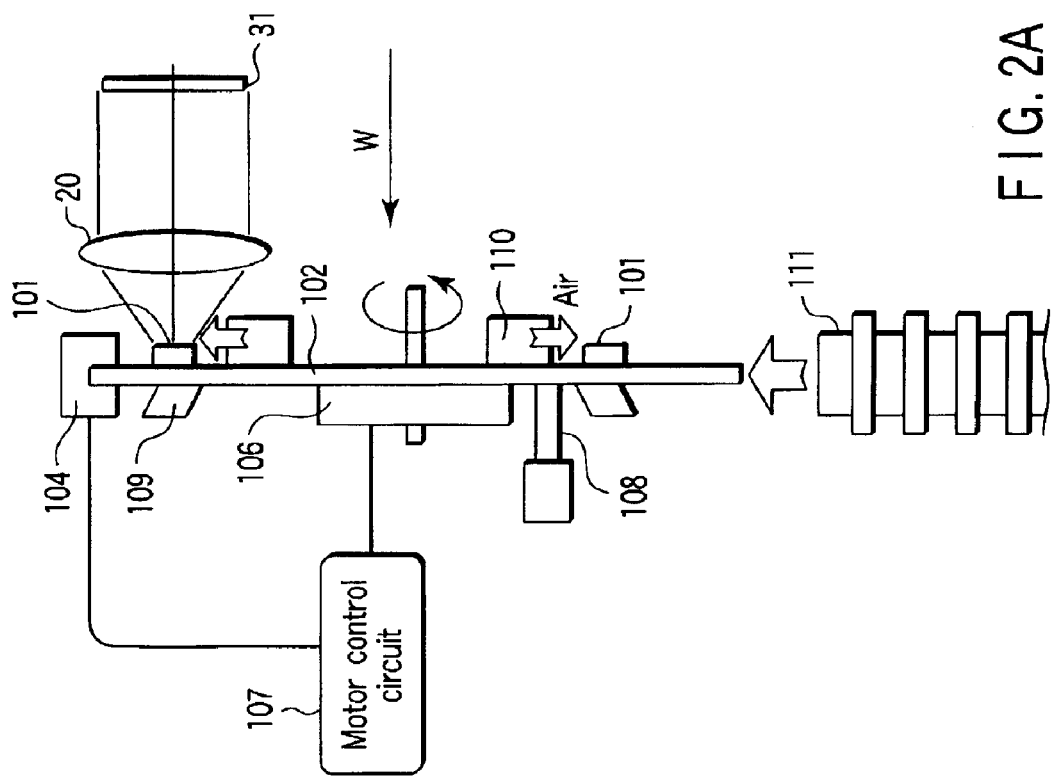
FIG. 2A is a side view showing the constitution of a successively moving emission illumination unit in the first embodiment.

FIG. 2A is a side view showing the constitution of the successively moving emission illumination unit 10, and FIG. 2B is a front view of a rotatable substrate in FIG. 2A seen in an arrow W direction. FIG. 3 is an electric block diagram of the successively moving emission illumination unit 10.

For this successively moving emission illumination unit 10, a plurality of light emitting members, for example, LEDs 101 well known as semiconductor light emitting elements are constituted to be rotatable/movable with regard to a predetermined emission point $P_A$. That is, a positional relation between the LED 101 positioned in the predetermined emission point $P_A$ and a portion to be illuminated 31 in which the image display element 30 is disposed is the same as that between the single LED and portion to be illuminated in a conventional illumination apparatus. Here, the successively moving emission illumination unit 10 includes a columnar rotatable substrate 102 which is a light control member for controlling movement of the LEDs 101. A plurality of LEDs 101 is mounted substantially on the same circumference in a plane portion of the rotatable substrate 102. In the successively moving emission illumination unit 10 constituted in this manner, by operation (rotation in the present embodiment) of the rotatable substrate 102, the LEDs 101 successively move toward the emission point $P_A$. The LEDs 101 successively emit lights when positioned in the vicinity of the emission point $P_A$.

To realize the operation of the LED 101 for successively emitting the light when positioned in the vicinity of the emission point $P_A$ in this manner, the successively moving emission illumination unit 10 includes a driving circuit 103, position sensor 104, LEDTG 105, motor 106, motor control circuit 107, and brush 108.

Here, the driving circuit 103 is lighting-on means for driving to turn-on each LED 101 mounted on the rotatable substrate 102.

The position sensor 104 detects a rotated position of the rotatable substrate 102. The LEDTG 105 selects the LED 101 positioned in the emission point $P_A$ from a detected result of the position sensor 104 to generate a lighting-on timing. The driving circuit 103 drives to turn the LED 101 on in response to the lighting-on timing from the LEDTG 105.

The motor 106 is movable means for periodically rotating/operating the rotatable substrate 102. The motor control circuit 107 controls the motor 106 based on information of the position sensor 104, and thereby controls the rotated position of the rotatable substrate 102 so as to successively move the plurality of LEDs 101 to the emission point P$_A$. That is, the motor control circuit 107, position sensor 104, and LEDTG 105 constitute light selection control means. When the motor control circuit 107 controls the operation of the rotatable substrate 102 by the motor 106, the plurality of LEDs 101 are successively positioned in the emission point P$_A$ with the rotation/movement of the rotatable substrate 102. Subsequently, the LEDTG 105 successively selects the LED 101 positioned in the emission point P$_A$ to generate the lighting-on timing. The driving circuit 103 allows the LED 101 positioned in the emission point P$_A$ to successively emit the light based on the lighting-on timing of the selected LED 101.

A wiring is disposed in a circular form (not shown) in the back surface of the rotatable substrate 102. The brush 108 constantly abuts on the wiring, and supplies power to the driving circuit 103 and LEDTG 105 disposed on the rotatable substrate 102.

When the successively moving emission illumination unit 10 is constituted in this manner, the plurality of different LEDs 101 can successively, periodically, and stably illuminate the portion to be illuminated 31.

Figure 4:
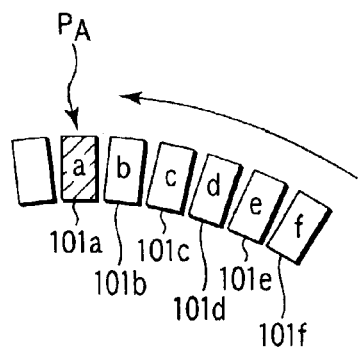
FIG. 4 is an enlarged view of an area $E_B$ of FIG. 2B.
Figure 5:
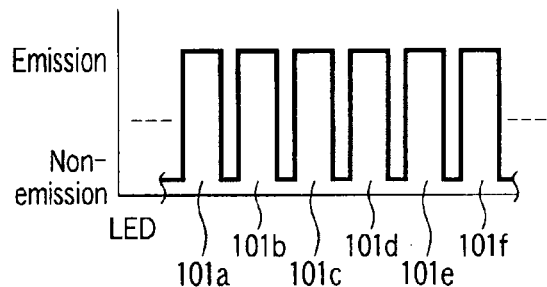
FIG. 5 is an explanatory view of a temporal emission state in an emission point $P_A$.

This will be described in more detail with reference to FIGS. 4 and 5. That is, FIG. 4 is an enlarged view of a part (area E$_B$) of the plurality of LEDs 101 on the same circumference of the rotatable substrate 102 in FIG. 2B. By rotation of the rotatable substrate 102 in an arrow direction, in the emission point P$_A$, the LED moves like 101*b*, 10*c*, 101*d*, 101*e*, 101*f* in order from 101*a*. A graph shown in FIG. 5 shows that with the movement, the LEDs 101*b*, 10*c*, 101*d*, 101*e*, 101*f* are selected in order from 101*a* to emit the light with an elapse of time in the emission point P$_A$. That is, as shown in FIG. 5, in the emission point P$_A$, emission and non-emission are repeated. As a result, when the successively moving emission illumination unit 10 constituted as described above is used, a plurality of LEDs 101 can realize the illumination apparatus which has a short non-emission time and which substantially constantly emits the light. Therefore, for example, when the interval between the LEDs is narrowed, and the LEDs are densely arranged, the non-emission time can be constituted to be short. Therefore, a longer emission time is obtained in the emission point P$_A$, and a large quantity of light can be obtained.

Moreover, when a period of movement of the LEDs is set to be as short as possible, a person cannot easily recognize flashing by repetition of non-emission/emission. More preferably, a time interval is set such that the flashing cannot be recognized by a person's effect of persistence of vision. This time interval at which the flashing cannot be recognized is concretely about 1/60 sec. or less. Therefore, the time interval of movement between the LEDs is preferably set to about 1/60 sec. or less.

Furthermore, when the LED 101 is allowed to emit the light only in the vicinity of the emission point P$_A$, the LED 101 can be cooled in a non-emission region. That is, the number of emissions of the LED 101 may be one in one period of rotation of the rotatable substrate 102, and therefore a long cooling period can be secured. The LED has a property that the generated heat is inversely proportional to the quantity of emitted light. Therefore, by a temperature drop caused by the cooling, it is possible to obtain more emission output.

Additionally, for example, even when one of the plurality of LEDs 101 breaks and does not emit the light, the quantity of emitted light is entirely reduced only by 1/this plural number. For the similar reason, the influence of an inevitably generated dispersion can be reduced in the manufacturing of the LED.

As described above, according to the first embodiment, when the different LEDs successively and constantly emit the light in the emission point P$_A$, the quantity of light by periodically stable emission and substantially constant emission can be increased, and cooling effect of the LED can be obtained. The influence by the breakage of the LED or manufacturing dispersion can secondarily be reduced.

Next, a modification example of the successively moving emission illumination unit 10 in the first embodiment will be described.

As described above, it is possible to obtain the cooling effect of the LED. However, as shown in FIG. 2A, when a radiator member 109 is disposed in the back surface of the rotatable substrate 102 other than an emitted light path of the LED 101, the cooling effect can further be enhanced. The radiator member 109 is constituted in a fin shape such that convection of air generated by the movement of the LED 101 can be used to efficiently radiate heat. The rotatable substrate 102 is constituted such that the heat generated by the LED 101 can easily be transmitted to the back surface. Therefore, when this fin-shaped radiator member 109 is attached to the back surface, air cooling is possible by the convection of air generated by rotation of the rotatable substrate 102, and a larger cooling effect can be obtained.

Moreover, a cooling fan 110 which is a blower blade member for the LED 101 is disposed on the inner peripheral side of a plane of the rotatable substrate 102 on which the light emitting member is mounted. When the cooling fan 110 guides air generated with the rotation of the rotatable substrate 102 as air for cooling into the LED 101, the LED 101 can be cooled.

Furthermore, a cooling air blower 111 is disposed in parallel with a rotation direction of the rotatable substrate 102 so as to function both on the LED 101 and radiator member 109, and a stronger cooling effect can be obtained in the constitution.

Figure 6:
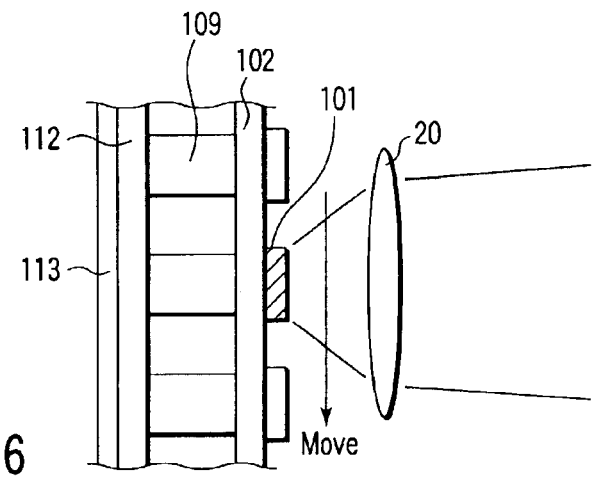
FIG. 6 is an enlarged sectional view of a light emitting portion according to a modification example of the first embodiment.

Alternatively, as shown in an enlarged sectional view of the light emitting portion of FIG. 6, a cooling device (Peltier element) 112 may be connected to the radiator member 109. Furthermore, in addition to the cooling device 112, a thermoelectric conversion element 113 for converting heat to electricity may also be disposed. In this case, the heat generation is inhibited, the power generated by the thermoelectric conversion element 113 can be used as a part of a power supply of the image projection apparatus, and therefore an effect is obtained that power saving is achieved.

For the application to the image projection apparatus shown in FIG. 1, the successively moving emission illumination unit 10 whose cooling effect is further enhanced in this manner is more preferably used. With the use of the successively moving emission illumination unit 10 whose cooling effect is further enhanced as the light source, there can be provided the image projection apparatus including the illumination, considering that the quantity of light is maintained or increased by the cooling with stable brightness and that there is little influence of breakage/dispersion of the light emitting member (LED).

Figure 7A:
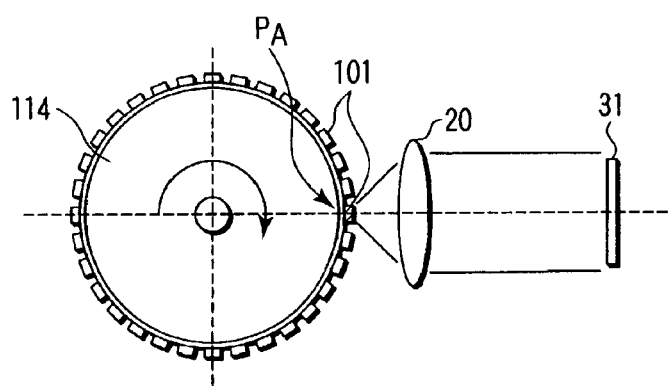
FIGS. 7A and 7B are a side view and top plan view of the successively moving emission illumination unit according to another modification example of the first embodiment.
Figure 7B:
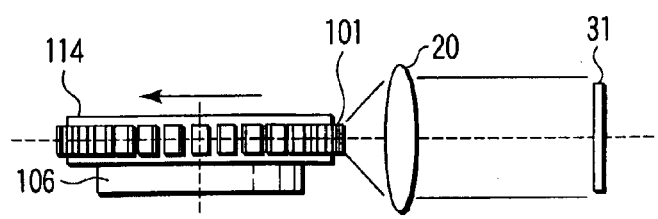

FIGS. 7A and 7B are a side view and top plan view showing another modification example of the successively moving emission illumination unit 10 in the first embodiment. That is, in the modification example, a plurality of LEDs 101 are mounted on a curved surface portion of a columnar rotatable member 114 as a light control member. When tracks of operation of the LED 101 are noticed, the tracks are on the same circumference as shown in FIGS. 2A and 2B, but are on the same outer periphery as shown in FIG. 7B.

As described above, in the present modification example, the LEDs are disposed on the same outer periphery on the curved surface, and the interval between the LEDs disposed adjacent to each other is kept to be uniform. Therefore, it is possible to prevent an interval difference of the emission/non-emission from being generated depending on the portion of the rotatable member 114.

It is to be noted that the flow of successively moving emission is similar to the model of FIGS. 2A and 2B, and therefore the corresponding part is omitted from the drawing (this also applies to each modification example described hereinafter).

Figure 8:
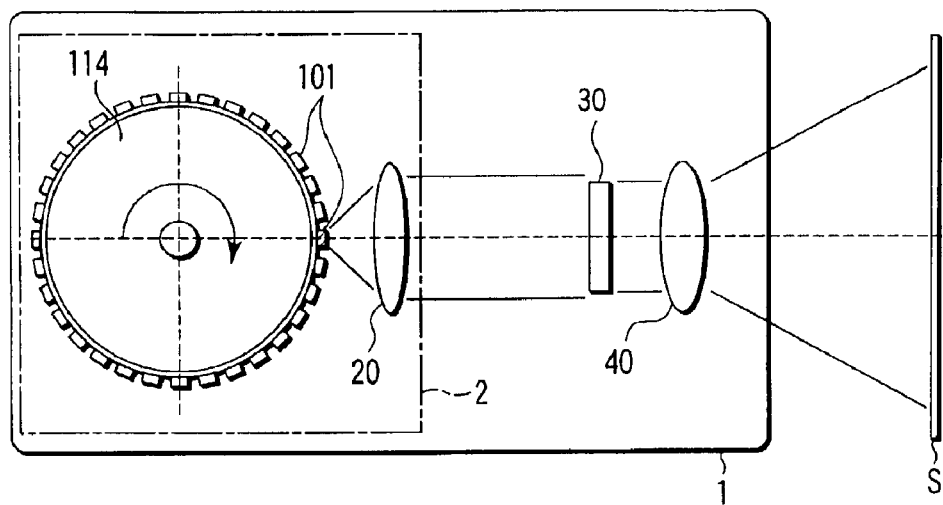
FIG. 8 is a diagram showing the constitution of the image projection apparatus according to the modification example of FIGS. 7A and 7B.

FIG. 8 is a diagram showing the constitution of the image projection apparatus 1 in which the successively moving emission illumination unit 10 is used. That is, this image projection apparatus 1 includes the successively moving emission illumination unit 10 in which a plurality of LEDs 101 are mounted on the curved surface portion of the columnar shape of the rotatable member 114 as shown in FIGS. 7A and 7B and in which the LED 101 positioned in the emission point $P_A$ successively emits the light with the rotation of the rotatable member 114. The apparatus also includes: the illumination optical system 20 for efficiently illuminating the image display element 30 with the light from the LED 101; the image display element 30 represented by LCD for displaying the image; and the projection optical system 40 for enlarging/projecting the image from the image display element 30 on the screen S. Even with this constitution, the image projection apparatus can be realized which produces an effect similar to that of the image projection apparatus shown in FIGS. 1 to 5.

Figure 9A:
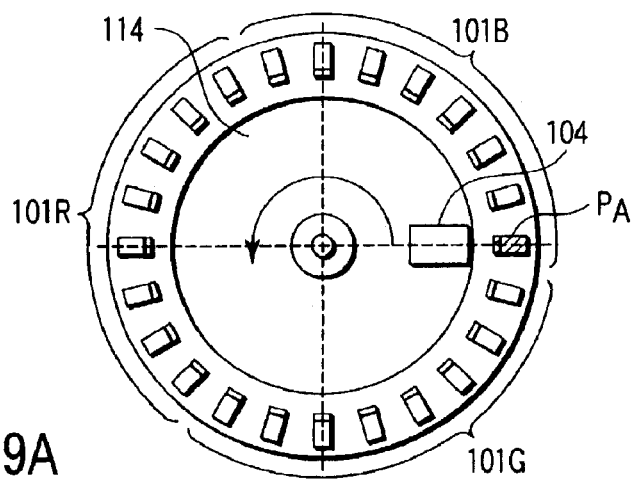
FIGS. 9A and 9B are a top plan view and side view of the successively moving emission illumination unit according to other modification example of the first embodiment.
Figure 9B:
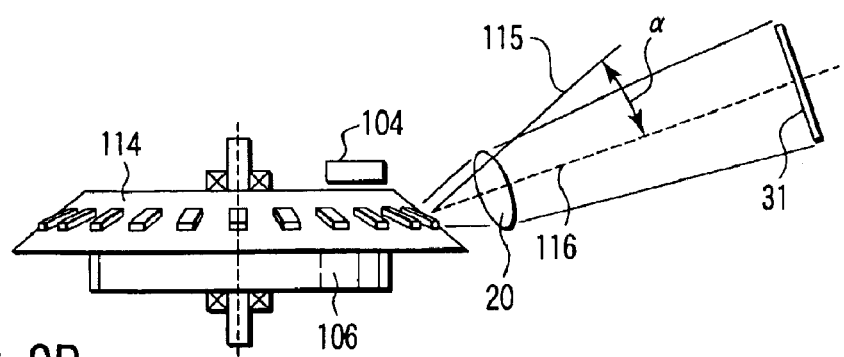

FIGS. 9A and 9B are a top plan view and side view showing a modification example in which the curved surface of the rotatable member 114 of FIGS. 7A and 7B is replaced with a slant surface. Moreover, in the present modification example, a light emitting member attaching surface is divided into three areas, one of three colors R (red), G (green), B (blue) is allotted to each area, and a plurality of LEDs 101 (101R, 101G, or 101B) of the corresponding color are disposed in each area. That is, three colors can be emitted with one rotation of the rotatable member 114 in the constitution (FIGS. 9A and 9B show that the LED 101B of color B is in the emission point $P_A$ and emits the light). In this constitution, the lights of a plurality of separate colors RGB can successively be emitted.

It is to be noted that naturally the colors are not limited to these three colors RGB. For example, although not shown, the member may also be constituted of three or more colors such as RGBW (W denotes white). Moreover, the respective adjacent LEDs may also be constituted to have changed colors.

Furthermore, in the present modification example, an angle (inclination angle: α) is formed by a normal 115 of the light emitting member attaching surface and an optical axis center 116 of the illumination optical system 20. Although the constitution has the inclination angle, the inclination angle may either be disposed or not be disposed. It is to be noted that similarly the inclination angle may either be disposed or not be disposed even in the other modification examples or embodiments.

Even when the successively moving emission illumination unit 10 constituted in this manner is used to constitute the image projection apparatus, the effect similar to that of the image projection apparatus shown in FIGS. 1 to 5 can be produced.

Figure 10:
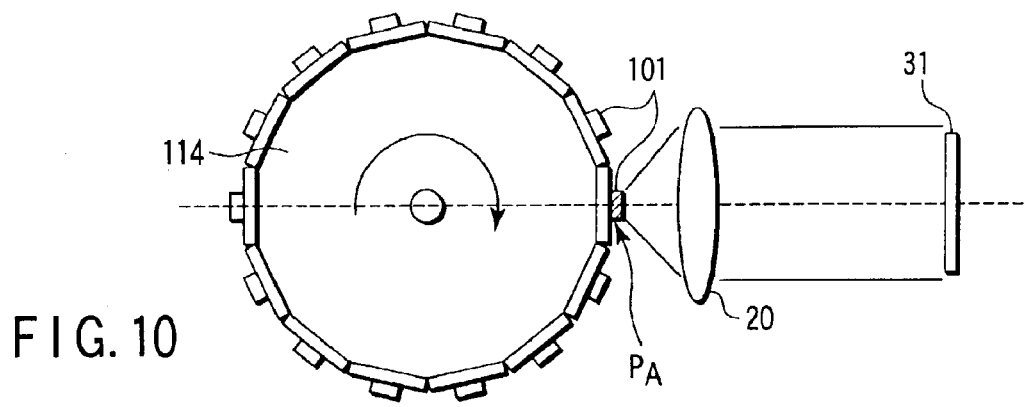
FIG. 10 is a side view of the successively moving emission illumination unit according to further modification example of the first embodiment.

FIG. 10 is a diagram showing still another modification example. In this example, the rotatable member 114 is constituted to have a polyhedral pole shape, not the columnar shape, and the LED 101 is disposed on each side. That is, when the plane LED 101 is mounted on the curved surface as shown in FIGS. 7A and 7B, contact becomes linear. When the member is mounted, a structure for filling a gap between the curved surface and plane is required, and the structure becomes complicated. On the other hand, when the LED 101 is mounted on the plane as in the present modification example, the mounting can be facilitated. Moreover, when the LED 101 is mounted on the curved surface, there is possibility that a focus point changes, optical aberration is generated, and efficiency of illumination drops in the portion to be illuminated 31. With the polygonal configuration shown in FIG. 10, especially when the LED is used as the light emitting member, the configuration of the present modification example has an advantage that the LED is easily mounted and optical design is ease.

Even when the successively moving emission illumination unit 10 configured in this manner is used to constitute the image projection apparatus, the effect similar to that of the image projection apparatus shown in FIGS. 1 to 5 can be produced.

It is to be noted that in the modification example of FIG. 10, one LED 101 is mounted on one plane forming the polygonal shape, but a plurality of light emitting members may also be formed.

Figure 11:
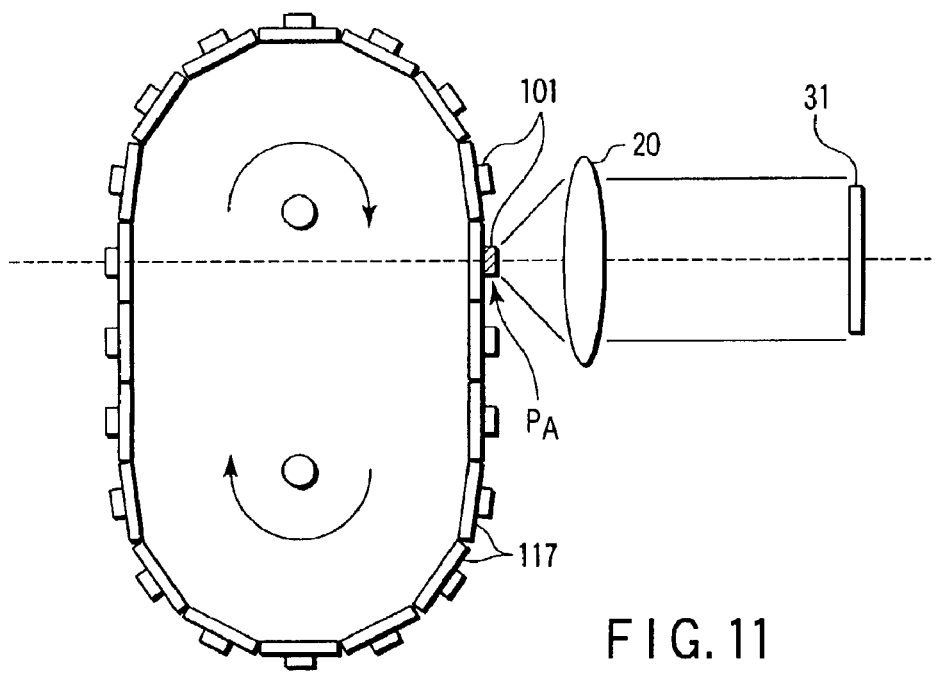
FIG. 11 is a side view of the successively moving emission illumination unit according to still further modification example of the first embodiment.

The respective sides of the polygonal shape may be constituted of separate substrates, and may be constituted to be movable with hinge members. Further in this case, as shown in FIG. 11, the constitution may include separate substrates 117 and hinges (not shown), and further an orbit may be elliptic to achieve a caterpillar configuration. This caterpillar configuration has an effect that it is possible to impart a degree of freedom to arrangement of a plurality of LEDs 101. It is to be noted that this caterpillar orbit is not limited to the elliptic shape, and may also have another shape so as to avoid interference with peripheral members (not shown). Even when the successively moving emission illumination unit 10 configured in this manner is used to constitute the image projection apparatus, the effect similar to that of the image projection apparatus shown in FIGS. 1 to 5 can be produced.

Figure 12:
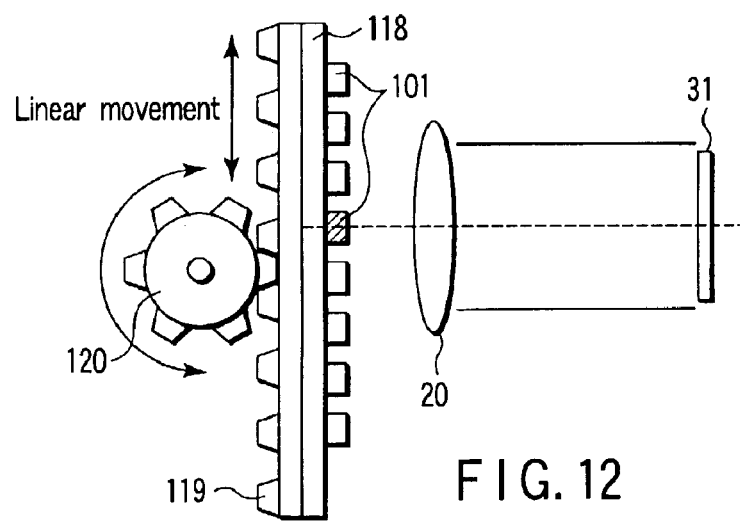
FIG. 12 is a side view of the successively moving emission illumination unit according to still another modification example of the first embodiment.

FIG. 12 is a diagram showing still further modification example of the successively moving emission illumination unit 10 according to the first embodiment, in which a plurality of LEDs 101 are moved in a linear direction. That is, in this modification example, a plurality of LEDs 101 are linearly mounted on a linearly movable substrate 118 which is a light control member. Moreover, by rotation of a pinion 120 meshed with a rack 119 added to the linearly movable substrate 118, the LEDs 101 linearly reciprocate in a mounted arrangement direction. It is to be noted that the position detection, light emitting circuit, and motor are the same as those of FIGS. 2A and 2B, and therefore the corresponding drawing and description are omitted.

Even when the successively moving emission illumination unit 10 configured in this manner is used to constitute the image projection apparatus, the effect similar to that of the image projection apparatus shown in FIGS. 1 to 5 can be produced. Furthermore, in constituting the image projection apparatus which is requested to be thin and may be relatively large in a direction crossing at right angles to the unit, the successively moving emission illumination unit 10 of such linearly moving type is especially effective.

It is to be noted that examples of another constitution for realizing the linear movement include a cam, screw/nut, crank, and linear motor. There are also many other constitutions for converting a rotary movement to the linear movement or for performing the linear movement, any of the constitutions may of course be applied.

Figure 13:
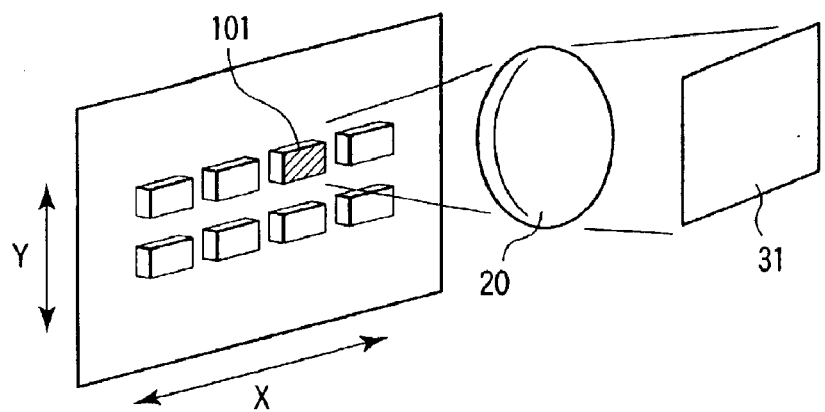
FIG. 13 is a side view of the successively moving emission illumination unit according to still further modification example of the first embodiment.

FIG. 13 is a diagram showing further modification of the modification example of FIG. 12. The linear movement uses two axes. That is, the unit is movable along two axes including X and Y directions as shown. By this two-dimensional arrangement of the LEDs 101, a large number of light emitting members can be mounted. Even when the successively moving emission illumination unit 10 configured in this manner is used to constitute the image projection apparatus, the effect similar to that of the image projection apparatus shown in FIGS. 1 to 5 can be produced.

Additionally, besides the above-described respective modification examples, various constitutions for realizing the successive movement of the plurality of light emitting members are considered. Any constitution may also be used, as long as the plurality of light emitting members can be moved to allow each light emitting member to emit the light in a predetermined light emitting member position.

The light control member including one movable member in which the plurality of LEDs 101 are disposed has been described above, but a plurality of (e.g., three) movable members each including a plurality of light emitting members may also be disposed.

Figure 14:
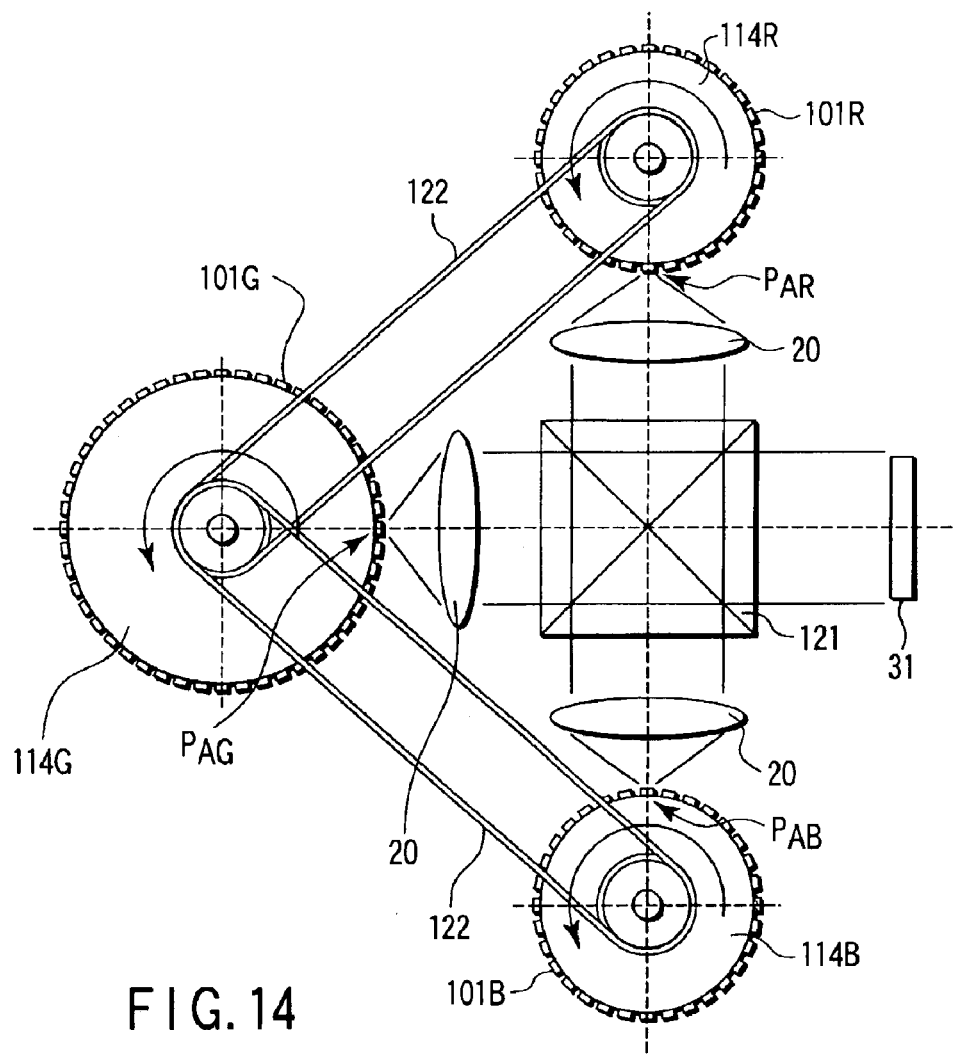
FIG. 14 is a side view of the successively moving emission illumination unit according to still other modification example of the first embodiment.

FIG. 14 is a diagram showing one example of this constitution. The example includes three rotatable members as the three movable members: a rotatable member 114R for R on which a plurality of LEDs 101R of R color are mounted; a rotatable member 114G for GR on which a plurality of LEDs 101G of G color are mounted; and a rotatable member 114B for B on which a plurality of LEDs 101B of B color are mounted. Moreover, the respective beams of the lights from the LEDs 101R, 101G, 101B positioned in emission points $P_{AR}$, $P_{AG}$, $P_{AB}$ of the rotatable members 114R, 114G, 114B of the respective colors are condensed to form substantially parallel light beams by an optical array, that is, the respective illumination optical systems 20. The lights are synthesized by color synthesis means generally referred to as a cross prism 121 which is a prism including a dichroic film to illuminate the portion to be illuminated 31. The respective rotatable members 114R and 114G, and 114G and 114B are constituted by belts 122 which are transmission means, so that a rotating power of the rotatable member can be transmitted to the other rotatable member. Therefore, when any of the plurality of rotatable members 114R, 114G, 114B is rotated, or any of the belts 122 is driven, all the rotatable members 114R, 114G, 114B can be rotated. Therefore, when the power for driving one rotatable member is supplied, all the rotatable members 114R, 114G, 114B are operated. For example, the same number of driving motors as that of the rotatable members is not required, and this is therefore cost-effective.

In this constitution, when the lights of three colors RGB are simultaneously emitted, substantially white illumination can be obtained. When only one light emitting member (LED) of one rotatable member emits the light, and one light emitting member of another rotatable member successively emits the light, an RGB color frame sequential illumination is obtained. In this manner, the rotatable member is disposed for each of the RGB colors, and further the lights are synthesized by the color synthesis means to obtain, for example, white illumination. In this case, it is possible to obtain a brightness greater than that of the white light emitting member including one rotatable member. Furthermore, when balance of the quantity of emitted light of each of the RGB colors is changed, the illumination of various colors can be realized. Additionally, to realize the RGB color frame sequential illumination, the respective rotatable members are allowed to emit the light in order. In this case, the illumination can be realized, and the emitted light color is easily selected.

Moreover, when the successively moving emission illumination unit 10 configured as shown in FIG. 14 is used to constitute the image projection apparatus, the portion to be illuminated 31 of FIG. 14 may be disposed in the position of the image display element 30 of FIG. 1. That is, in this manner, in the portion to be illuminated 31, the image display elements 30 such as an LCD element and a digital micro-mirror device (DMD: registered trademark of U.S. Texas Instruments Co.) are disposed, and the lights are successively emitted in order of RGB. Additionally, when the image display element 30 is synthesized and driven, the color frame sequential image projection apparatus can be formed.

It is to be noted that in FIG. 14 diameters of the rotatable members 114R, 114G, 114B for the respective colors are changed for the following reason. That is, the quantity of light is not easily obtained with respect to the output in the LED 101G of the G color, and a large emission output is required to be dominant in human visibility. For this, a large current needs to be supplied to the LED 101G of the G color. However, the generated heat increases by the supplied large current, and further cooling is required. To solve the problem, only for the G color, the rotatable member 114G having a larger diameter is disposed, and more LEDs 101G are arranged. Accordingly, a cooling period for one light emitting member, which is longer than that for another color (R, B), is obtained, and a cooling effect is enhanced.

[Second Embodiment]

Next, a second embodiment of the present invention will be described. In the second embodiment, the light path of the light from the light emitting member for illuminating the portion to be illuminated is changed in a predetermined period.

Figure 15:
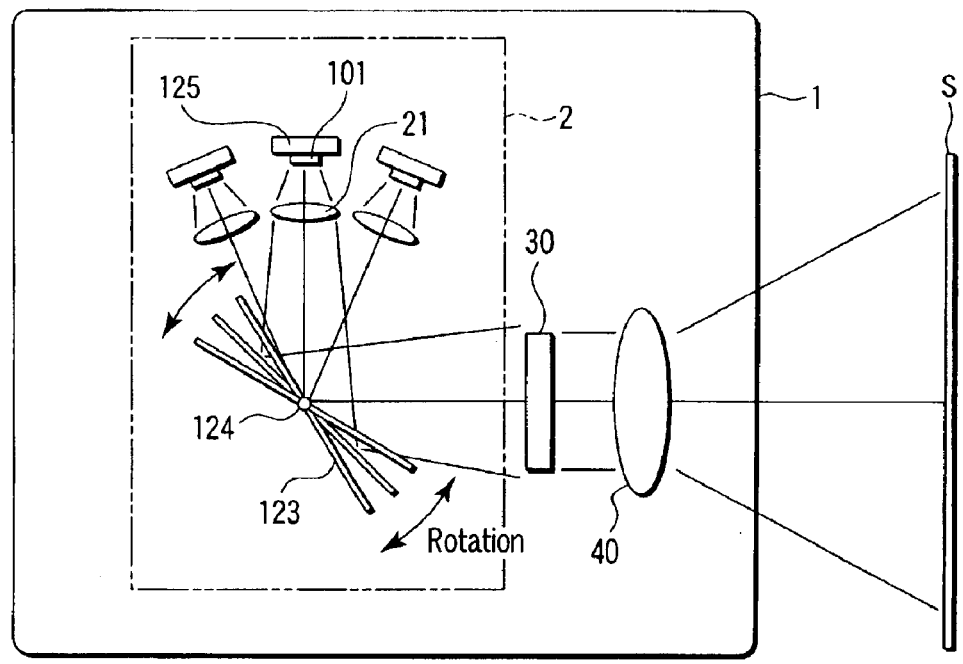
FIG. 15 is a function block diagram of the image projection apparatus according to a second embodiment of the present invention in which the illumination apparatus according to the second embodiment of the present invention is used.

FIG. 15 is a function block diagram of the image projection apparatus 1 according to the second embodiment of the present invention in which the illumination apparatus 2 according to the second embodiment of the present invention is used. In the image projection apparatus 1, the LED 101 which can illuminate the image display element 30 as the portion to be illuminated is selected in accordance with the state of a mirror 123 which rotates as a light control member, and the emission can be controlled. The image projection apparatus 1 further includes: the image display element 30 represented by the LCD for displaying the image; and the projection optical system 40 for enlarging/projecting the image from the image display element 30 on the screen S. That is, the mirror 123 is swung along a predetermined rotation axis 124 so that the light path can be controlled. In the rotated position, the light from one of the plurality of LEDs 101 is selectively reflected with respect to the image display element 30.

Figure 16:
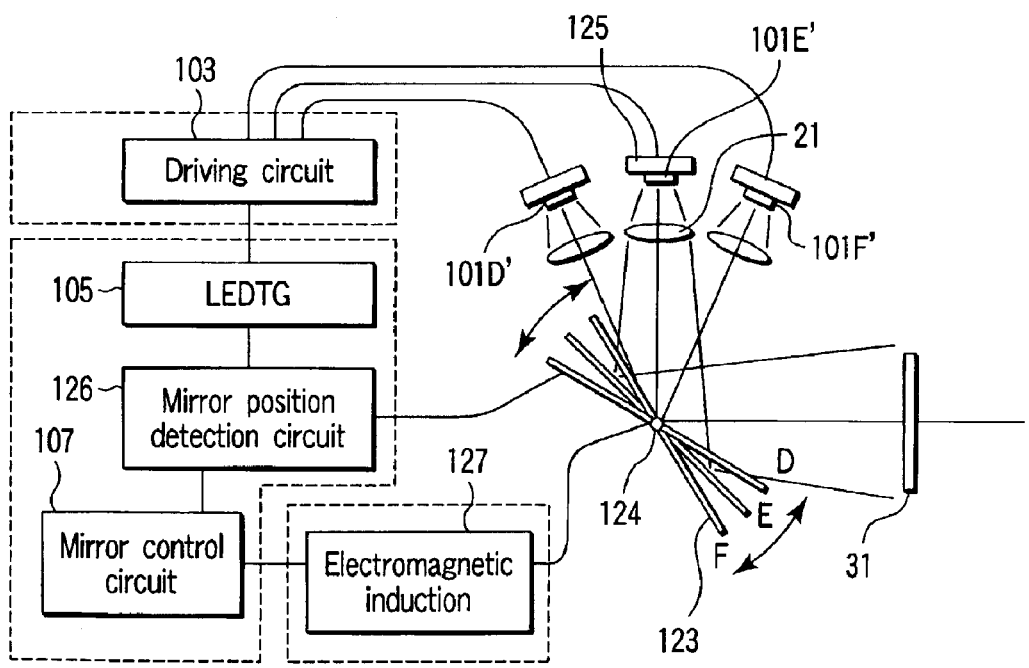
FIG. 16 is an explanatory view of details of a main part of the image projection apparatus according to the second embodiment.

The main part of the image projection apparatus 1 according to the second embodiment will be described in more detail with reference to FIG. 16. That is, LEDs 101D', 101E', 101F' are mounted on three substrates 125. Condenser lenses 21 which are condensing means for condensing the lights emitted from the LEDs 101D', 101E', 101F' onto the portion to be illuminated 31 are disposed opposite to the LEDs 101D', 101E', 101F', respectively. Furthermore, between the condenser lenses 21 and portion to be illuminated 31, the mirror 123 is disposed which is the light control member for changing the light path of the light from the light emitting member (LED) for illuminating the portion to be illuminated 31. This mirror 123 can rotate/reciprocate/move centering on the predetermined rotation axis 124, and is constituted to reflect the light from the LED 101D', 101E', or 101F' onto the portion to be illuminated 31 in mirror positions D, E, or F.

The rotated position of the mirror 123 can be detected by a mirror position detection circuit 126. The LEDTG 105 selects the LED 101D', 101E', or 101F' based on mirror position information from the mirror position detection circuit 126 to generate a lighting-on timing. The selected LED emits the light by the driving circuit 103 which is lighting-on means for turning the selected LED on. In this manner, the LED which can illuminate the portion to be illuminated 31 can selectively be allowed to emit the light. For example, when the mirror 123 is in a position D, the light is selectively emitted from the LED 101D'. The mirror 123 is rotated by: an electromagnetic induction 127 which is movable means for rotatively operating the mirror; and a mirror control circuit 128 which can control the electromagnetic induction 127 based on the information from the mirror position detection circuit 126.

Accordingly, in the image projection apparatus 1 constituted in this manner, the movable means operates the mirror 123, and the mirror position detection circuit 126 and LEDTG 105 which are light selection control means successively select the LED 101, which can illuminate the portion to be illuminated 31, based on the position information of the mirror 123 to generate the lighting-on timing. The driving circuit 103 as the lighting-on means successively emits the light from the successively selected LED.

For the effect of the constitution of the light control member which changes the light path using the mirror 123, it is not necessary to move the light emitting member (LED), and the power is therefore easily supplied to the light emitting member. Additionally, the constitution can be compact by a foldable mirror. It is to be noted that the effects such as the enhancement of the quantity of light of the light emitting member, the stable quantity of light of the light emitting member, and the reduction of the dispersion are obtained in the same manner as in the first embodiment, and the detailed description is omitted.

Figure 17:
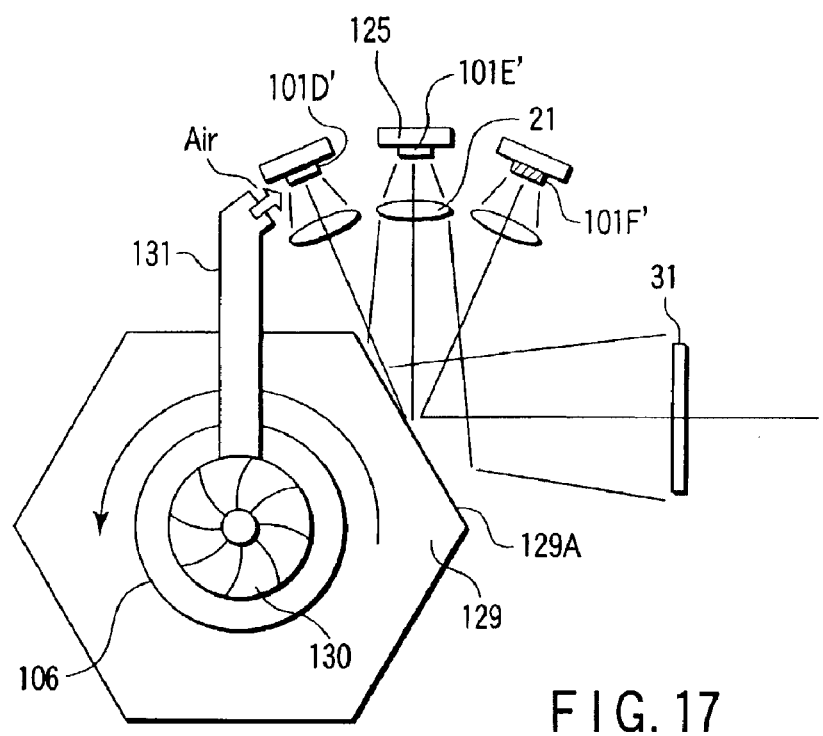
FIG. 17 is a diagram showing the modification example of the second embodiment.

FIG. 17 is a diagram showing the modification example of the second embodiment. In the modification example, instead of the rotating mirror 123 in FIG. 16, a polygon mirror 129 is used in which a plurality of mirrors 129A are arranged in a regular polygon shape. By the rotation of the polygon mirror 129, the light emitting member position can be selected. That is, when the respective mirrors 129A have angular positions corresponding to the rotation positions D, E, F in the rotating mirror 123, the LEDs 101D', 101E', 101F' are selectively allowed to emit the light, and the portion to be illuminated 31 are illuminated with the light reflected by the polygon mirror 129. It is to be noted that the light selection control by the mirror position is similar to the model of FIG. 16, and the description of this portion is omitted (in the same manner as in the following modification examples).

Moreover, a fan 130 is constituted to be coaxial with the rotation axis of the polygon mirror 129, and a duct 131 is disposed to guide the air exhausted from this fan 130 to the vicinity of the LEDs 101D', 101E', 101F'. With the rotating operation of the polygon mirror 129, the fan 130 also operates, and the LEDs 101D', 101E', 101F' can be air-cooled via the duct 131. In this constitution, the polygon mirror 129 is rotated, and the cooling can simultaneously be performed.

Figure 18A:
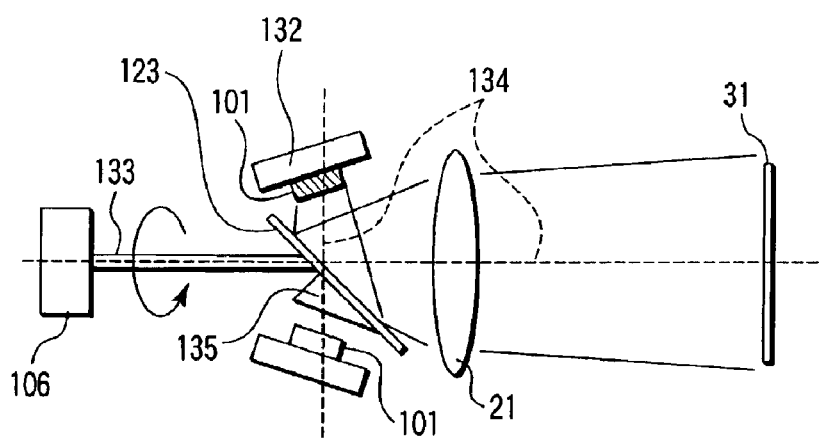
FIGS. 18A and 18B are a sectional view and front view showing still another modification example of the second embodiment.
Figure 18B:
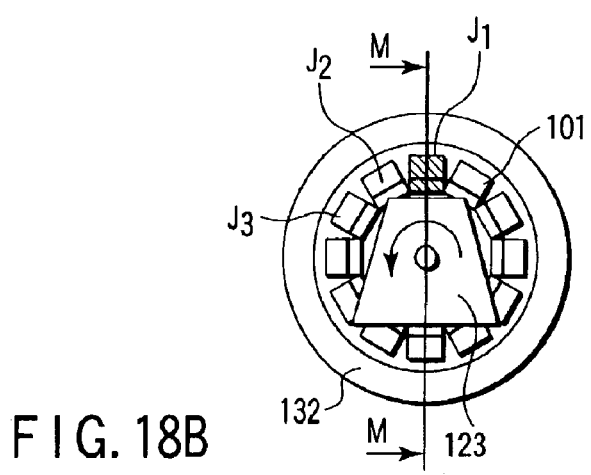

FIGS. 18A and 18B are diagrams showing still another modification example of the second embodiment. Especially, FIG. 18A is a sectional view along an MM arrow line of FIG. 18B. Also in this modification example, the light from the LED 101 is passed through the condenser lens 21, which is condensing means for efficiently condensing the light onto the portion to be illuminated 31, to illuminate the portion to be illuminated 31. The mirror 123 for bending the light path is inserted between the condenser lens 21 and LED 101. Additionally, in this case, in consideration of ease of the mounting of the LED 101, the LED 101 is constituted to be oblique with respect to the light axis of the condenser lens 21.

That is, the mirror 123 for performing the light selection control is constituted to be rotatable between the LED 101 and condenser lens 21. Furthermore, the LED 101 is disposed substantially on the same periphery as that of a light emitting member attaching member 132 which has a mortar shape and whose bottom surface is opened. It is to be noted that the mortar-shaped light emitting member attaching member 132 aims at the ease of the mounting of the LED 101, but may also be cylindrical, not mortar-shaped. Moreover, the mirror 123 for reflecting the light of the LED 101 at right angles to the portion to be illuminated 31 is disposed inside the same periphery of the LED 101.

In the back surface of the mirror 123, there are disposed: a rotation shaft 133 for rotating the mirror 123, and the motor 106 as a driving device which can rotate the rotation shaft 133. Here, the rotation shaft 133 is disposed substantially in the center of a light emitting member array in the same periphery. When the rotation shaft 133 is rotated, the mirror 123 rotates. The light path to the portion to be illuminated 31, that is, a light axis 134 of the condenser lens 21 can selectively be disposed with respect to one of the emission positions of the plurality of LEDs 101. Moreover, when the LED 101 in the selected emission position emits the light, the portion to be illuminated 31 is illuminated. For example, FIG. 18B shows that the LED 101 in an emission position $J_1$ emits the light. However, with the elapse of time, the mirror 123 rotates. With the rotation, the LED in the corresponding emission position $J_2$, and the LED in an emission position $J_3$, . . . are constituted to successively emit the light.

Moreover, in the present modification example, in addition to the rotation shaft 133, a blower member 135 is formed in the back surface of the mirror 123. When the rotation shaft 133 is rotated, wind is generated by the blower member 135, and this wind can cool the LEDs 101.

According to the modification example, the plurality of LEDs 101 can be selected with respect to one condenser lens 21 via the mirror 123 which changes the light path. Accordingly, the LEDs 101 can effectively be disposed in an empty space in the vicinity of the condenser lens 21, and the size of the illumination apparatus 2 can be constituted to be compact. Furthermore, the LEDs 101 are densely arranged. By the effect that the non-emission time can be shortened as described with reference to FIG. 5, it is possible to obtain a large quantity of light. The blower member 135 in the back surface of the mirror 123 can cool the LEDs 101, and it is possible to reduce a drop in the quantity of emitted light by heat resistance generated by the heat generation of the LED 101.

It is to be noted that for the image projection apparatus of the first and second embodiments, a single-panel image projection apparatus constituted of one image display element 30 has been described. Naturally, a plurality of image display elements are disposed and, for example, the apparatus may be of an (RGB) three-panels type. Moreover, in the image display element 30, not only the LCD (transmission or reflection type) element but also a digital micro-mirror device (DMD®) may be used.

[Third Embodiment]

Figure 19A:
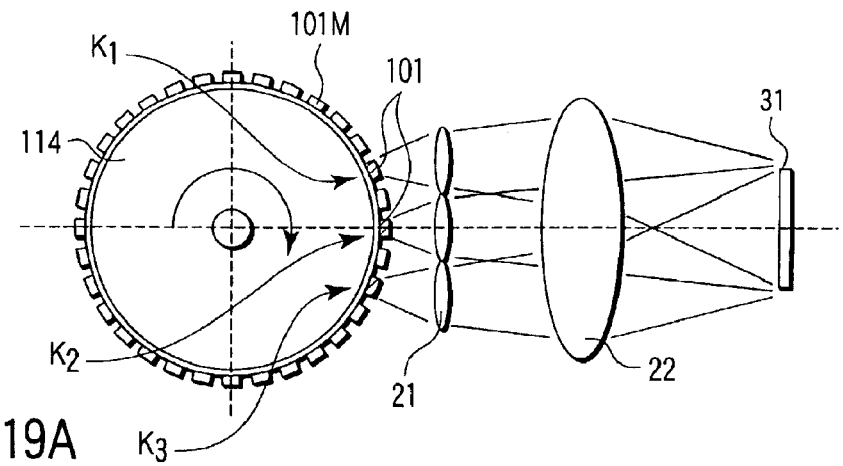
FIGS. 19A and 19B are a side view and top plan view of the illumination apparatus according to a third embodiment of the present invention.
Figure 19B:
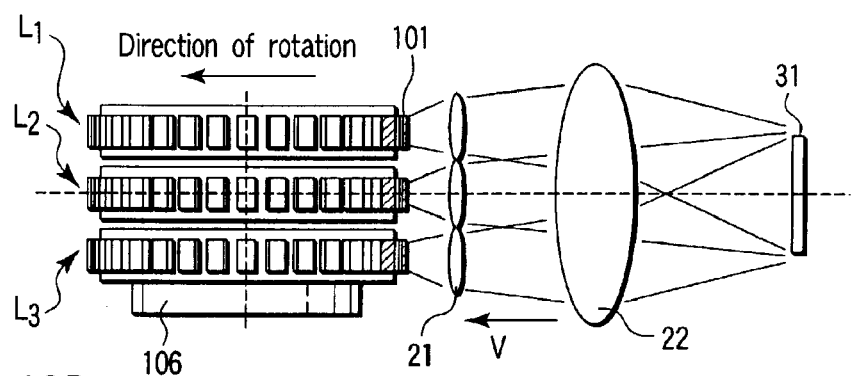
Figure 20:
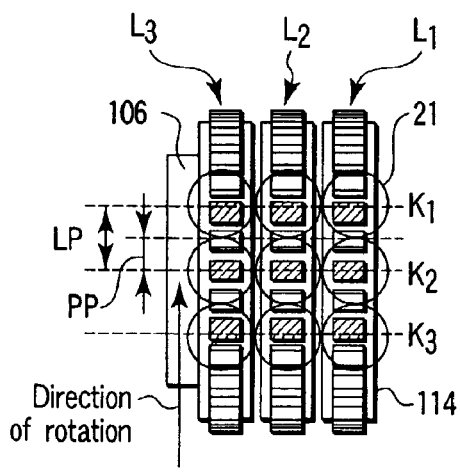
FIG. 20 is a V arrow view in FIG. 19B.
Figure 21:
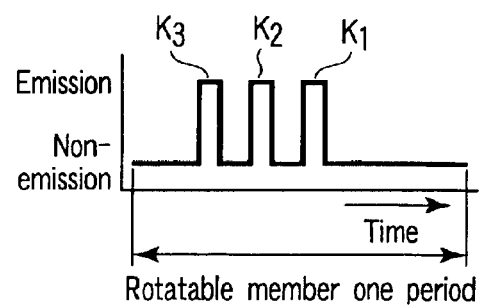
FIG. 21 is a diagram showing the emission state with an elapse of time in one period of rotation of one light emitting member.

Next, a third embodiment of the present invention will be described. In the first and second embodiments, one light emitting member (LED) is selectively allowed to emit the light. In the third embodiment, a plurality of light emitting members (LED) are simultaneously selected to emit the light. FIG. 19A is a side view of the illumination apparatus according to the third embodiment including a rotating constitution in which a plurality of (nine) LEDs can simultaneously emit the light, and FIG. 19B is a top plan view. FIG. 20 is a V arrow view in FIG. 19B, that is, a view seen on the side of the portion to be illuminated, and FIG. 21 shows an emission state with an elapse of time in one period of rotation of an LED 101M in FIG. 19A.

That is, in the present embodiment, as shown in FIG. 19A, the LEDs 101 are disposed in the curved surface portion of the columnar rotatable member 114 in the same manner as in the modification example of the first embodiment shown in FIGS. 7A and 7B. For the emission points of the LEDs, the LEDs 101 can simultaneously emit the light in three portions such as emission point lines $K_1$, $K_2$, and $K_3$ in the moving direction of the rotatable member 114. As shown in FIG. 19B, three arrays of LEDs 101 including LED array lines $L_1$, $L_2$, $L_3$ can simultaneously emit the light. Therefore, as shown in FIG. 20, the LEDs in nine portions in total simultaneously emit the light in two dimensions of 3×3 LEDs arrays. Naturally, instead of simultaneously emitting the light from nine portions, the lights may also be emitted in slightly deviating phases. The simultaneous turning-on may also be performed for each of lines $L_1$, $L_2$, $L_3$ or for each of lines $K_1$, $K_2$, and $K_3$.

Moreover, the illumination apparatus of the present embodiment includes: nine condenser lenses 21 which form a multi emission point optical system and which are disposed opposite to the nine emission points, respectively; and a superposing lens 22 for superposing the lights from the condenser lenses 21. That is, the superposing illumination optical system 20 which can superpose the lights from the respective LEDs upon the portion to be illuminated 31 is constituted of these condenser lenses 21 and superposing lens 22.

Therefore, in this constitution, when the rotatable member 114 rotates, the LEDs 101 pass through the emission point lines $K_1$, $K_2$, and $K_3$, and the LED positioned in the vicinity of the emission point emits the light. This operation will be described while one LED is noticed. One LED 101M shown in FIG. 19A has an emission state as shown in FIG. 21 in one period of the rotatable member 114. That is, when the LED 101M moves to be positioned in the emission point line $K_3 \rightarrow K_2 \rightarrow K_1$, the emission is performed three times, and non-emission is performed at other times. It is to be noted that the third embodiment is similar to the first embodiment except that there are plurality of simultaneous emissions, and therefore the drawing of the constitution resulting in the operation and the description of the function are omitted.

The plurality of LEDs 101 simultaneously emit the lights in this manner, and the lights of the plurality of LEDs 101 are superposed to illuminate the portion to be illuminated 31. This can produce an effect that a quantity of illumination light, larger than the quantity of light obtained from one light emitting member, can be obtained.

Moreover, in the arrangement of the LEDs 101, as shown in FIG. 20, assuming that a condenser lens pitch of the condenser lenses 21 in the rotating direction of the rotatable member 114 is LP and a light emitting member pitch in the rotating direction of the rotatable member 114 is PP, the arrays are constituted so that PP is denser than LP. Accordingly, the non-emission time can be shortened in each emission point as compared with the constitution in which LP is the same as PP. Therefore, an effect is that more quantity of emitted light can be obtained. The LEDs are preferably constituted to be densest in the same manner as in a case in which the total quantity of emitted light decreases with a longer non-emission time of each LED of FIG. 5 (in the present embodiment, for the sake of description, a state is shown in which the light emitting members are arranged at intervals).

It is to be noted that the simultaneous selective emissions of the plurality of light emitting members (LED) according to the third embodiment may be constituted in the illumination apparatus in which the light path of the light from the light emitting member for illuminating the portion to be illuminated is changed in the predetermined period as in the second embodiment as follows. That is, in the rotatable member position shown in FIGS. 19A and 19B, a system is constituted in which the same number of mirrors 123, light emitting member attaching members 132, rotation shafts 133, and motors 106 as the number of condenser lens arrays (nine sets in FIG. 19A) are disposed. This can produce an effect that the constitution can be miniaturized, when the LED 101 is disposed in the empty space between the condenser lens arrays.

Figure 22:
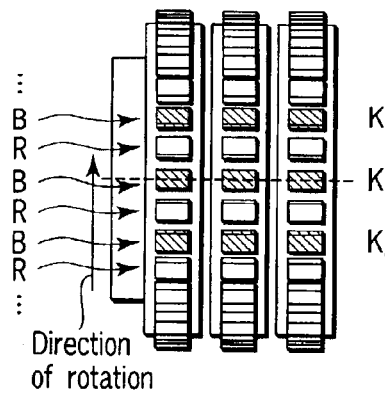
FIG. 22 is a diagram showing a modification example of a third embodiment.

FIG. 22 is a diagram showing the modification example of the third embodiment, and is a V arrow view similar to FIG. 20. To simplify the description, the condenser lens 21 is omitted from the diagram. This modification example has a constitution for realizing the color frame sequential (alternate) emissions of two colors B (blue) and R (red). That is, in the shown state, the LEDs of B emit the lights in nine emission points. With the rotation of the rotatable member 114, the LEDs of R move to the nine emission points and emit the light in the vicinity of the emission points. The constitution has this repetition of BR alternate emissions. With this arrangement of the LEDs, the color frame sequential (alternate) emissions can easily be realized.

Moreover, in the modification example, the colors of the LEDs disposed adjacent to each other in the moving direction are different. However, although not shown, when the portion to be illuminated 31 is illuminated with the white light, all the LEDs may also be constituted of white. Alternatively, the portion may be illuminated in white, when the plurality of LEDs constituted of the plurality of colors (RGB) emit the lights in consideration of emission strength ratio and visibility. Furthermore, although not shown, in the simultaneous emission of the plurality of LEDs which are constituted that the LEDs of the plurality of colors can simultaneously emit the lights, the predetermined color other than white is generated by the synthesized color of the LEDs of the plurality of colors, and it is also possible to realize the illumination of the predetermined color.

Figure 23:
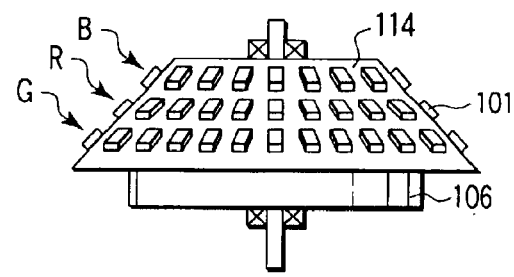
FIG. 23 is a diagram showing another modification example of the third embodiment.

Furthermore, as shown in FIG. 23, the curved surface of the rotatable member 114 is replaced with the slant surface, and the LED array may also be disposed for each of the plurality of colors RGB. In this case, the number of LEDs differs with each color, and the number of LEDs is set to be small in order of B, R, G. From a balance between the visibility and intensity of the LED which is the light emitting member, the number of LEDs for each color of RGB is estimated so as to obtain the white color. As a result, more LEDs are required in order of B, R, G, and this result is reflected. Naturally, the luminance and resistance characteristic of the LED may be considered to change the shown number or color positions.

Figure 24:
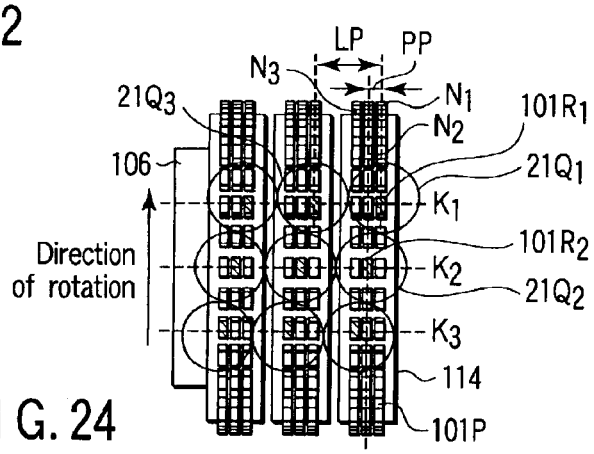
FIG. 24 is a diagram showing further modification example of the third embodiment.

FIG. 24 is a diagram showing further modification example of the third embodiment. This diagram is also the V arrow view similar to FIG. 20. However, nine lines are disposed in the moving direction of the light emitting members (LED). In this modification example, a plurality of LED movement lines (lines $N_1$ to $N_3$) is disposed in the lens interval between the condenser lenses. Furthermore, when one condenser lens $21Q_1$ is noticed, any of the lines $N_1$ to $N_3$ passes in a range of the condenser lens $21Q_1$. However, only LED 101R$_1$ is controlled to emit the light, the LED 101R$_1$ of the line $N_1$ is designed to be optimum in condensing the light, and the condenser lens $21Q_1$ is constituted substantially centering on the LED 101R$_1$. Similarly, when a condenser lens $21Q_2$ is noticed, only LED 101R$_2$ of the line $N_2$ is controlled to emit the light, and the condenser lens $21Q_2$ is constituted substantially centering on the LED 101R$_2$. Since the other condenser lenses are similar, the description thereof is omitted.

Figure 25:
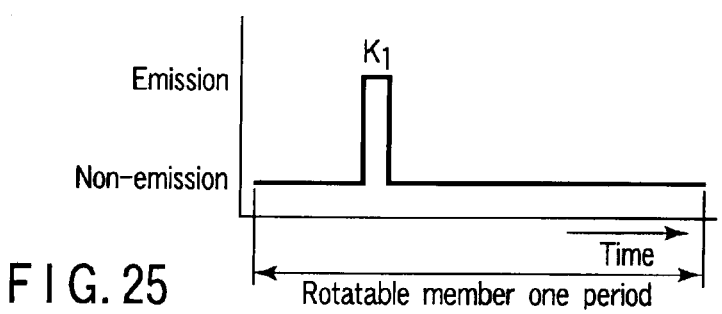
FIG. 25 is a diagram showing the emission state with the elapse of time in one period of rotation of one light emitting member in the modification example of FIG. 24.

In this constitution, one LED is noticed in FIG. 25, and the emission state of an LED 101P in one period of the rotatable member 114 is shown. In this manner, the LED 101P emits the light only when moved to the vicinity of the line $K_1$. This is known to produce an effect that with the light emitting member of the LED, the quantity of emitted light drops by the generated heat in the LED. However, in the present modification example, one emission is performed in one period. As a result, the constitution is advantageous for the heat generation of the LED. Therefore, a larger current can be applied with one emission of the LED, and a larger quantity of light can be obtained.

Moreover, the interval PP between the LED array lines $N_1$ and $N_2$, which is the interval between the LEDs disposed adjacent to each other, is set to be denser than the lens interval LP between the condenser lenses $21Q_1$ and the adjacent condenser lens $21Q_3$. This produces an effect that the light emitting members (LED) on the rotatable member 114 can densely be constituted, the unit can be miniaturized and the quantity of light can also be raised.

Furthermore, in a modification example different from FIG. 24, when the portion to be illuminated is set to be broader with respect to the predetermined emission point, and there is no fear of heat generation in accordance with use conditions, the LEDs can simultaneously emit the light not only in the LED array line $N_1$ in the condenser lens $21Q_1$, but also in the LED array lines $N_2$, $N_3$ in one condenser lens even with a drop in efficiency. In this constitution, one emission in one period, or a plurality of (three) emissions in one period can also be selected.

Moreover, although not shown, the constitution of FIGS. 19A and 19B includes three movement lines, that is, the LED array lines $L_1$ to $L_3$ of the rotatable member 114, but may be divided into separate movable parts to rotate at separate movement speeds. Alternatively, a speed of movement may be set to be variable, so that the LED moves slowly when moving to the vicinity of the emission position, and moves fast, when not in the emission position.

Furthermore, when a plurality of light emitting members (LED) are simultaneously selected to emit the lights as in the third embodiment, not only the constitution of FIG. 19A corresponding to FIG. 7A and but also various constitutions in the first and second embodiments described with reference to the drawings such as FIGS. 10 and 11 and so on may easily be modified and adapted to the constitution of the simultaneous selection emission of the plurality of light emitting members (LED).

The present invention has been described above based on the embodiments, but the present invention is not limited to the above-described embodiments, and can of course variously modified or applied in the scope of the present invention.

Figure 26:
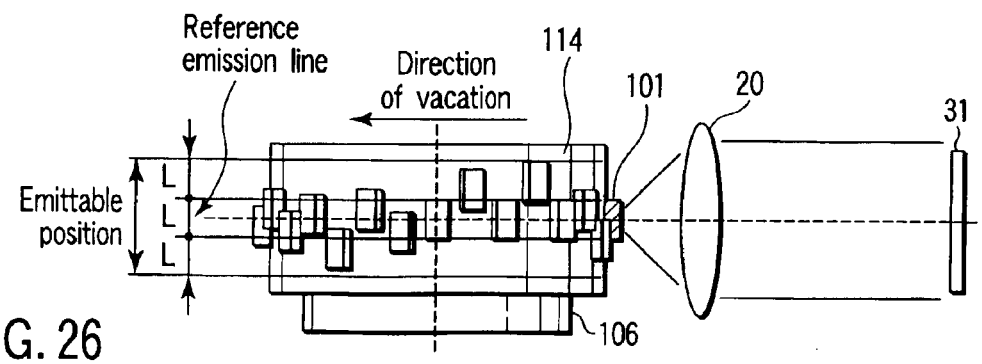
FIG. 26 is an explanatory view of a modification example for reducing illumination unevenness.

For example, in the first to third embodiments, the light emitting members (LED) are aligned, but may also be arranged with deviation. This will be described with reference to FIG. 26. It is to be noted that one LED for the simultaneous emission is assumed in the description. For example, when the light emitting member is assumed to be the LED, a bonding wire is disposed in an emission surface in the vicinity of the center of the chip of LED, and the vicinity sometimes becomes dark. The illumination optical system 20 in the constitution of FIG. 26 is constituted to form the image of the LED 101 on the rotatable member 114 into the image in the portion to be illuminated 31. As a result, the bonding wire portion of the LED and the portion having a luminance drop in the vicinity cause illumination unevenness as such in the portion to be illuminated 31 because of the luminance drop. Furthermore, when the plurality of LEDs 101 on the rotatable member 114 are formed substantially in the same shape, the rotatable member 114 is moved to allow the plurality of LEDs to successively emit the light substantially in the same position in a reference emission line which is substantially the width of the LED. Then, when the lights are temporally superposed, the emission unevenness of the LED 101 is maintained as the illumination unevenness of the portion to be illuminated 31. To solve the problem, as shown in FIG. 26, the plurality of LEDs 101 are arranged so as to deviate from one another in a direction crossing at right angles to the rotating direction of the rotatable member 114. In this case, the illumination unevenness of the LED itself can deviate to be illuminating the portion to be illuminated 31. Further by the temporal superposition generated by the rotation of the rotatable member 114 including the deviating LEDs 101, the illumination unevenness is averaged, and it is possible to reduce the illumination unevenness in the portion to be illuminated 31.

It is to be noted that when a relation among the LED positions, illumination optical system, and portion to be illuminated is optimized, an illumination loss increases by the deviation of the LED position from the reference emission line. In consideration of the balance between the illumination unevenness and illumination efficiency, the present inventors have found that the deviation corresponding to the size (L) of the LED is preferably an emittable position.

Moreover, although not especially shown, instead of arranging the LEDs 101 in one arrow, the LEDs 101 are arranged on opposite sides of the light emitting member (LED) array of FIG. 26 to constitute three arrays. Even when the LED deviates, one of the LEDs disposed on the opposite sides of the LED is disposed in the reference emission line. In this case, when one of the LEDs disposed in the reference emission line on the opposite sides of the LED is constituted to emit the light, the efficiency is prevented from being deteriorated, and the illumination unevenness can be prevented.

Furthermore, in the first to third embodiments, the LED which is the light emitting member has been shown and described, but the present invention is not limited to the LED. For example, even with a carbon nano tube (CNT) light source as the light emitting member in which the heat generated by the constant lighting-on causes the drop in the quantity of light and which has a response speed with respect to the emission and in which the emission is therefore possible in a pulse manner, the constitution described in the embodiments can produce the similar effect.

Moreover, in the above-described embodiments, the illumination apparatus of the image projection apparatus has been described. However, in synchronization with the driving of the image display element, the illumination apparatus of the present invention may also be allowed to emit the light. In this case, it is possible to obtain the image projection apparatus good in illumination efficiency and high in quality level.

Furthermore, the illumination apparatus of the image projection apparatus has been described, but the illumination apparatus constituted of the portion to be illuminated with respect to the predetermined light emitting member position can easily be applied to a backlight of a liquid crystal display apparatus. When the portion to be illuminated is assumed as a spatial virtual region, the present invention can also be applied as a general illumination apparatus or a car headlight.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An illumination apparatus which illuminates a portion to be illuminated with light from a light source, comprising:
   a plurality of light emitting members which constitute the light source;
   a driving circuit configured to drive the respective light emitting members;
   a condenser optical system configured to condense an emitted light from the light emitting member driven by the driving circuit onto the portion to be illuminated;
   a light control member configured to perform at least one of change of a light path of the light from the light emitting member to illuminate the portion to be illuminated and movement of the light emitting member;
   a movable section configured to operate the light control member in a predetermined period;
   a light selection control section configured to control at least one of the movable section and driving circuit so as to select the light to illuminate the portion to be illuminated from the lights of the plurality of light emitting members,
   wherein the driving circuit drives the light emitting members so that several of the light emitting members among the plurality of light emitting members emit light simultaneously in at least a part of a light emitting period and
   wherein the condenser optical system comprises a multi emission point optical system formed of a plurality of optical systems disposed at approximately the same interval as a pitch (LP) of emission points of the light emitting members which emit light simultaneously.

2. The illumination apparatus according to claim 1, wherein the movable section moves to rotate the light control member.

3. The illumination apparatus according to claim 2, wherein the light control member has a columnar shape, and the light emitting members are arranged in a plane portion of the columnar shape.

4. The illumination apparatus according to claim 2, wherein the light control member has a columnar shape, and the light emitting members are arranged in a curved surface portion of the columnar shape.

5. The illumination apparatus according to claim 1, wherein the movable section moves to linearly move the light control member.

6. The illumination apparatus according to claim 5, wherein the light control member has a plane portion, and the light emitting members are arranged in the plane portion of the light control member.

7. The illumination apparatus according to claim 5, wherein the linear movement includes a linear movement in two directions crossing at right angles to each other.

8. The illumination apparatus according to claim 1, wherein the light control member comprises a plurality of light control members.

9. The illumination apparatus according to claim 8, wherein the light emitting members, each being respectively mounted on one of the plurality of light control members, emit light of colors different from those of the light emitting members mounted on the different light control members, and
   the apparatus further comprising: a color synthesis member configured to synthesize the lights from the different light emitting members.

10. The illumination apparatus according to claim 8, wherein the movable section comprises transmission members configured to transmit operations of the plurality of light control members to each other.

11. The illumination apparatus according to claim 8, wherein the condenser optical system comprises an optical array configured to condense the lights from the plurality of light emitting members onto the portion to be illuminated via optical systems disposed for the respective light emitting members, and
   the light control member is disposed for each optical system disposed for each of the plurality of light emitting members.

12. The illumination apparatus according to claim 1, wherein the light control member in the movable section is a mirror, and
   the mirror is configured to swing about a predetermined rotation axis.

13. The illumination apparatus according to claim 1, wherein the light control member in the movable section is a mirror, and the mirror is configured to rotate in a predetermined direction.

14. The illumination apparatus according to claim 1, wherein emission points of the multi emission point optical system have a two-dimensional arrangement.

15. The illumination apparatus according to claim 14, wherein the light emitting members which emit the lights in the emission points of the multi emission point optical system emit the light of different emission colors.

16. The illumination apparatus according to claim 15, wherein a synthesized color of the different emission colors is white.

17. The illumination apparatus according to claim 14, wherein the light emitting members which emit the lights in the emission points of the multi emission point optical system comprise light emitting members of a single color.

18. The illumination apparatus according to claim 1, wherein an interval (PP) between the light emitting members arranged in the light control member is smaller than an interval (LP) of a plurality of optical systems of the multi emission point optical system.

19. The illumination apparatus according to claim 1, wherein the light selection control section controls the emission point in a light emitting member optimum position onto which the lights are condensed by the condenser optical system in such a manner that the light is emitted in an emission position different from the emission point.

20. The illumination apparatus according to claim 19, wherein a deviation of the emission point from the emission position is not more than a size of the light emitting member.

21. The illumination apparatus according to claim 1, wherein the plurality of light emitting members comprise a plurality of different colors.

22. The illumination apparatus according to claim 21, wherein the plurality of colors are three colors red (R), green (G), blue (B).

23. The illumination apparatus according to claim 1, wherein the light control member further comprises a cooling mechanism configured to cool the light emitting member by the operation of the light control member.

24. The illumination apparatus according to claim 23, wherein the cooling mechanism comprises at least one of a radiator member and blower blade member in addition to an optical use portion of the light control member.

25. The illumination apparatus according to claim 1, wherein the light emitting member is a semiconductor light emitting element.

26. The illumination apparatus according to claim 1, wherein the light emitting member is a carbon nano tube light emitting element.

27. An image projection apparatus comprising:
an illumination apparatus which illuminates a portion to be illuminated with light from a light source, including:
a plurality of light emitting members which constitute the light source;
a driving circuit configured to drive the respective light emitting members;
a condenser optical system configured to condense an emitted light from the light emitting member driven by the driving circuit onto the portion to be illuminated;
a light control member configured to perform at least one of change of a light path of the light from the light emitting member to illuminate the portion to be illuminated and movement of the light emitting member;
a movable section configured to operate the light control member in a predetermined period; and
a light selection control section configured to control at least one of the movable section and driving circuit so as to select the light to illuminate the portion to be illuminated from the lights of the plurality of light emitting members;
an image display element disposed in the portion to be illuminated of the illumination apparatus;
a projection optical system configured to project an image of the image display element to display an enlarged image,
wherein the driving circuit drives the light emitting members so that several of the light emitting members among the plurality of light emitting members emit light simultaneously in at least a part of a light emitting period, and wherein the condenser optical system comprises a multi emission point optical system formed of a plurality of optical systems disposed at approximately the same interval as a pitch (LP) of emission points of the light emitting members which emit light simultaneously.

28. The image projection apparatus according to claim 27, wherein the movable section moves to rotate the light control member.

29. The image projection apparatus according to claim 28, wherein the light control member has a columnar shape, and the light emitting members are arranged in a plane portion of the columnar shape.

30. The image projection apparatus according to claim 28, wherein the light control member has a columnar shape, and the light emitting members are arranged in a curved surface portion of the columnar shape.

31. The image projection apparatus according to claim 27, wherein the movable section moves to linearly move the light control member.

32. The image projection apparatus according to claim 31, wherein the light control member has a plane portion, and the light emitting members are arranged in the plane portion of the light control member.

33. The image projection apparatus according to claim 31, wherein the linear movement includes a linear movement in two directions crossing at right angles to each other.

34. The image projection apparatus according to claim 27, wherein the light control member comprises a plurality of light control members.

35. The image projection apparatus according to claim 34, wherein the respective light emitting members mounted on the plurality of light control members emit the light of colors different from those of the light emitting members mounted on the different light control members, and
the illumination apparatus further comprising: a color synthesis member configured to synthesize the lights from the different light emitting members.

36. The image projection apparatus according to claim 34, wherein the movable section comprises transmission members configured to transmit operations of the plurality of light control members to each other.

37. The image projection apparatus according to claim 34, wherein the condenser optical system comprises an optical array configured to condense light from the plurality of light emitting members onto the portion to be illuminated via optical systems disposed for the respective light emitting members, and
the light control member is disposed for each optical system disposed for each of the plurality of light emitting members.

38. The image projection apparatus according to claim 27, wherein the light control member in the movable section is a mirror, and
the mirror is configured to swing about a predetermined rotation axis.

39. The image projection apparatus according to claim 27, wherein the light control member in the movable section is a mirror, and
the mirror is configured to rotate in a predetermined direction.

40. The image projection apparatus according to claim 27, wherein emission points of the multi emission point optical system have a two-dimensional arrangement.

41. The image projection apparatus according to claim 40, wherein the light emitting members which emit the lights in the emission points of the multi emission point optical system emit the lights of different emission colors.

42. The image projection apparatus according to claim 41, wherein a synthesized color of the different emission colors is white.

43. The image projection apparatus according to claim 40, wherein the light emitting members which emit the lights in the emission points of the multi emission point optical system comprise light emitting members of a single color.

44. The image projection apparatus according to claim 40, wherein an interval between the light emitting members arranged in the light control member is smaller than an emission point interval of the plurality of emission points of the multi emission point optical system.

45. The image projection apparatus according to claim 27, wherein the light selection control section controls the emission point in a light emitting member optimum position onto which the lights are condensed by the condenser optical system in such a manner that the light is emitted in an emission position different from the emission point.

46. The image projection apparatus according to claim 45, wherein a deviation of the emission paint from the emission position is not more than a size of the light emitting member.

47. The image projection apparatus according to claim 27, wherein the plurality of light emitting members comprise a plurality of colors.

48. The image projection apparatus according to claim 47, wherein the plurality of colors are three colors red (R), green (G), blue (B).

49. The image projection apparatus according to claim 27, wherein the light control member further comprises a cooling mechanism configured to cool the light emitting member by the operation of the light control member.

50. The image projection apparatus according to claim 49, wherein the cooling mechanism comprises at least one of a radiator member and blower blade member in addition to an optical use portion of the light control member.

51. The image projection apparatus according to claim 27, wherein the light emitting member is a semiconductor light emitting element.

52. The image projection apparatus according to claim 27, wherein the light emitting member is a carbon nano tube light emitting element.

53. An illumination apparatus which illuminates a portion to be illuminated with a light from light source, comprising:

a plurality of light emitting members which constitute the light source;

driving means for driving the respective light emitting members;

condenser means for condensing an emitted light from the light emitting member driven by the driving means onto the portion to be illuminated;

light control means for performing at least one of change of a light path of the light from the light emitting member to illuminate the portion to be illuminated and movement of the light emitting member;

movable means for operating the light control member in a predetermined period;

light selection control means for controlling at least one of the movable means and driving means so as to select the light to illuminate the portion to be illuminated from the lights of the plurality of light emitting members, wherein the driving means drives the light emitting members so that several of the light emitting members among the plurality of light emitting members emit light simultaneously in at least a part of a light emitting period, and wherein the condenser means comprises multi emission point optical means formed of a plurality of optical means disposed at approximately the same interval as a pitch (LP) of emission points of the light emitting members which emit light simultaneously.

54. An image projection apparatus comprising:

an illumination apparatus for illuminating a portion to be illuminated with light from a light source, including:

a plurality of light emitting members which constitute the light source;

driving means for driving the respective light emitting members;

condenser means for condensing an emitted light from the light emitting member drove by the driving means onto the portion to be illuminated;

light control means for performing at least one of change of a light path of the light from the light emitting member to illuminate the portion to be illuminated and movement of the light emitting member;

movable means for operating the light control member in a predetermined period; and light selection control means for controlling at least one of the movable means and driving means so as to select the light to illuminate the portion to be illuminated from the lights of the plurality of light emitting members;

image display means disposed in the portion to be illuminated of the illumination apparatus;

a projection optical system configured to project an image of the image display element to display enlarged image;

wherein the driving means drives the light emitting members so that several of the light emitting members among the plurality of light emitting members emit light simultaneously in at least a part of a light emitting period, and wherein the condenser means comprises multi emission point optical means formed of a plurality of optical means disposed at approximately the same interval as a pitch (LP) of emission points of the light emitting members which emit light simultaneously.

* * * * *

UNITED STATES PATENT AND TRADEMARK OFFICE
CERTIFICATE OF CORRECTION

PATENT NO. : 6,899,435 B2
DATED : May 31, 2005
INVENTOR(S) : Kazuya Yamanaka

It is certified that error appears in the above-identified patent and that said Letters Patent is hereby corrected as shown below:

<u>Column 23,</u>
Line 20, after "emission", delete "paint" and insert -- point --.

Signed and Sealed this

Twenty-first Day of March, 2006

JON W. DUDAS
*Director of the United States Patent and Trademark Office*